(12) United States Patent
Ulichney et al.

(10) Patent No.: US 9,569,709 B2
(45) Date of Patent: Feb. 14, 2017

(54) DATA BEARING MEDIUM

(71) Applicant: Hewlett-Packard Development Company, L.P., Fort Collins, CO (US)

(72) Inventors: Robert Ulichney, Stow, MA (US); Matthew D Gaubatz, Seattle, WA (US); Steven J Simske, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/916,708

(22) PCT Filed: Sep. 6, 2013

(86) PCT No.: PCT/US2013/058407
§ 371 (c)(1),
(2) Date: Mar. 4, 2016

(87) PCT Pub. No.: WO2015/034510
PCT Pub. Date: Mar. 12, 2015

(65) Prior Publication Data
US 2016/0217357 A1    Jul. 28, 2016

(51) Int. Cl.
*G06K 19/06* (2006.01)
*G06T 1/60* (2006.01)

(52) U.S. Cl.
CPC ... *G06K 19/06037* (2013.01); *G06K 19/06103* (2013.01); *G06T 1/60* (2013.01)

(58) Field of Classification Search
CPC .................. G06K 19/06037; G06K 19/06103
See application file for complete search history.

(56) References Cited

U.S. PATENT DOCUMENTS

| | | | |
|---|---|---|---|
| 7,313,251 B2 | 12/2007 | Rhoads | |
| 7,664,967 B2 | 2/2010 | Thorpe | |
| 7,738,659 B2 | 6/2010 | Moskowitz | |
| 7,751,596 B2 | 7/2010 | Rhoads | |
| 2003/0107753 A1* | 6/2003 | Sakamoto | H04N 1/41 358/1.9 |
| 2007/0272750 A1* | 11/2007 | Bjorklund | G06F 3/03545 235/435 |

OTHER PUBLICATIONS

International Search Report and Written Opinion of the International Searching Authority, mailed May 26, 2014, issued in related PCT Application No. PCT /US2013/058407.

* cited by examiner

*Primary Examiner* — Kristy A Haupt
(74) *Attorney, Agent, or Firm* — HP Inc. Patent Department

(57) ABSTRACT

An example method for forming a data-bearing medium in accordance with aspects of the present disclosure includes setting variables associated with the data-bearing medium, the variables comprising a bit length of a payload, a row-to-row offset and an interleave period, identifying a standard form of the payload, the standard form being a circularly shifted version of the payload, generating a phase code based on the variables, and arranging rows of the data-bearing medium with the standard form of the payload and the phase code based on the interleave period.

15 Claims, 14 Drawing Sheets

| Shift | $b_3$ | $b_2$ | $b_1$ | $b_0$ | Decimal Value |
|---|---|---|---|---|---|
| 0 | 1 | 1 | 0 | 0 | 12 |
| 1 | 0 | 1 | 1 | 0 | 6 |
| 2 | 0 | 0 | 1 | 1 | 3 |
| 3 | 1 | 0 | 0 | 1 | 9 |

Fig. 2A

| Shift | $b_3$ | $b_2$ | $b_1$ | $b_0$ | Decimal Value |
|---|---|---|---|---|---|
| 0 | 1 | 0 | 1 | 0 | 10 |
| 1 | 0 | 1 | 0 | 1 | 5 |
| 2 | 1 | 0 | 1 | 0 | 10 |
| 3 | 0 | 1 | 0 | 1 | 5 |

Fig. 2B

| Shift | $b_{15}$ | $b_{14}$ | $b_{13}$ | $b_{12}$ | $b_{11}$ | $b_{10}$ | $b_9$ | $b_8$ | $b_7$ | $b_6$ | $b_5$ | $b_4$ | $b_3$ | $b_2$ | $b_1$ | $b_0$ | Decimal Value |
|---|---|---|---|---|---|---|---|---|---|---|---|---|---|---|---|---|---|
| 0 | 1 | 0 | 1 | 1 | 0 | 0 | 1 | 0 | 0 | 0 | 0 | 0 | 1 | 0 | 1 | 0 | 45578 |
| 1 | 0 | 1 | 0 | 1 | 1 | 0 | 0 | 1 | 0 | 0 | 0 | 0 | 0 | 1 | 0 | 1 | 22789 |
| 2 | 1 | 0 | 1 | 0 | 1 | 1 | 0 | 0 | 1 | 0 | 0 | 0 | 0 | 0 | 1 | 0 | 44162 |
| 3 | 0 | 1 | 0 | 1 | 0 | 1 | 1 | 0 | 0 | 1 | 0 | 0 | 0 | 0 | 0 | 1 | 22081 |
| 4 | 1 | 0 | 1 | 0 | 1 | 0 | 1 | 1 | 0 | 0 | 1 | 0 | 0 | 0 | 0 | 0 | 43808 |
| 5 | 0 | 1 | 0 | 1 | 0 | 1 | 0 | 1 | 1 | 0 | 0 | 1 | 0 | 0 | 0 | 0 | 21904 |
| 6 | 0 | 0 | 1 | 0 | 1 | 0 | 1 | 0 | 1 | 1 | 0 | 0 | 1 | 0 | 0 | 0 | 10952 |
| 7 | 0 | 0 | 0 | 1 | 0 | 1 | 0 | 1 | 0 | 1 | 1 | 0 | 0 | 1 | 0 | 0 | 5476 |
| 8 | 0 | 0 | 0 | 0 | 1 | 0 | 1 | 0 | 1 | 0 | 1 | 1 | 0 | 0 | 1 | 0 | 2738 |
| 9 | 0 | 0 | 0 | 0 | 0 | 1 | 0 | 1 | 0 | 1 | 0 | 1 | 1 | 0 | 0 | 1 | 1369 |
| 10 | 1 | 0 | 0 | 0 | 0 | 0 | 1 | 0 | 1 | 0 | 1 | 0 | 1 | 1 | 0 | 0 | 33452 |
| 11 | 0 | 1 | 0 | 0 | 0 | 0 | 0 | 1 | 0 | 1 | 0 | 1 | 0 | 1 | 1 | 0 | 16726 |
| 12 | 0 | 0 | 1 | 0 | 0 | 0 | 0 | 0 | 1 | 0 | 1 | 0 | 1 | 0 | 1 | 1 | 8363 |
| 13 | 1 | 0 | 0 | 1 | 0 | 0 | 0 | 0 | 0 | 1 | 0 | 1 | 0 | 1 | 0 | 1 | 36949 |
| 14 | 1 | 1 | 0 | 0 | 1 | 0 | 0 | 0 | 0 | 1 | 0 | 1 | 0 | 1 | 0 | 0 | 51242 |
| 15 | 0 | 1 | 1 | 0 | 0 | 1 | 0 | 0 | 0 | 0 | 0 | 1 | 0 | 1 | 0 | 1 | 25621 |

Fig. 3

DATA BEARING MEDIUM

BACKGROUND

Technologies for enabling data-bearing hard copy afford a number of interesting applications, including labels, packaging, signage, and documents in general. Non-limiting examples of data-bearing media may include data-bearing magnetic media (e.g., magnetic storage), data-bearing optical media (e.g., optical storage), data-bearing atomic media (e.g., atomic storage), data-bearing images, etc. For example, data-bearing images may include data-bearing halftoned images (e.g., halftoned images in which explicit data is added by altering the halftone structure in a controlled/causal way), graphical alpha-numerics, barcodes, etc.

One approach of enabling data bearing properties may be encoding information in the halftone of an image. Halftone screening techniques represent one of the methods imaging companies have used to improve the quality of printed pieces. These techniques can possibly improve the aesthetic qualities and fidelity of printed reproductions. Clustered-dot halftoning converts the original image into a series of dots of varying size to simulate tonal difference, displaying detail in the image. Darker areas of the image are printed with larger dots and lighter areas are printed with smaller dots. These different sized dots absorb the light reflecting from the paper in varying amounts thus giving the illusion of different shades of gray while printing with only black ink.

BRIEF DESCRIPTION OF THE DRAWINGS

Example implementations are described in the following detailed description and in reference to the drawings, in which:

FIG. 2A illustrates a table of an example of the right circular shifts of a string of data in accordance with an implementation;

FIG. 2B illustrates a table of an example of the right circular shifts of another string of data;

FIG. 3 illustrates a table of an example of the right circular shifts of another string of data in accordance with an implementation;

DETAILED DESCRIPTION

Figure 1:
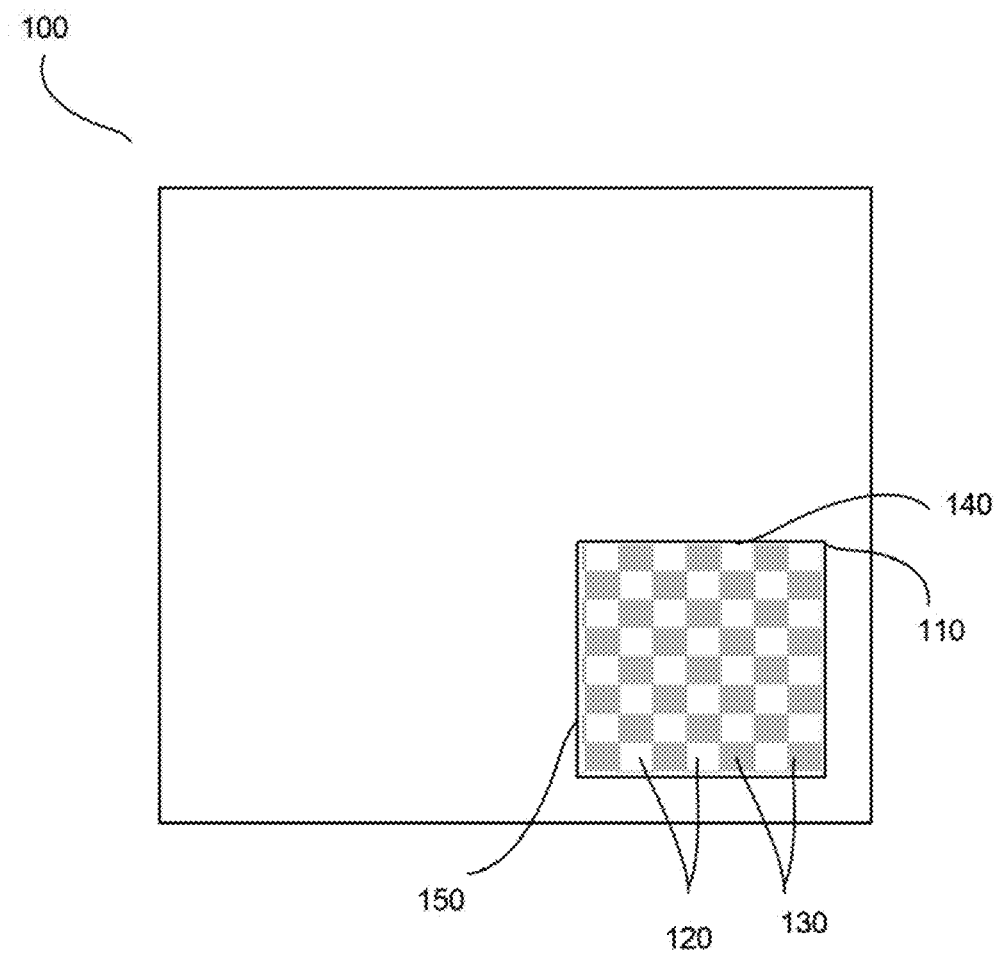
FIG. 1 illustrates an example data-bearing medium in accordance with an implementation.

Various implementations described herein are directed to producing a high quality image with an encoded message. More specifically, and as described in greater detail below, various aspects of the present disclosure are directed to a manner by which a set of processes are implemented to encode a message throughout an image that can be recovered when only a rectangular subset or window of that image while producing better quality halftones.

Aspects of the present disclosure described herein implement a comprehensive and integrated tool that allows recovering data from some data-bearing media. According to various aspects of the present disclosure, the approach described herein allows a user to view information without having to capture an entire array of data-bearing elements, such as an entire data-bearing medium. Accordingly, the approach described herein allows the use of capture devices having fields of view that are smaller than an entire data-bearing medium, meaning that only a portion of the data-bearing medium can be captured.

Moreover, aspects of the present disclosure described herein also disclose a structured array of data-bearing elements of a data-bearing medium containing an array of bits, where a certain number of the bits in the array of bits repeat and where positions of the bits in each line (e.g., row or column) of the array of bits are circularly shifted from positions of the bits in an immediately preceding line. For example, the certain number of the bits in the array of bits may be a circularly shifted version of a payload of the data-bearing medium. Among other things, this approach allows a portion of the data-bearing medium to include at least a shifted version of the payload and the row-to-row shift, meaning that the shifted version of the payload and the row-to-row shift can be determined from the portion of the data-bearing medium. The payload can then be recovered by shifting the shifted version. Accordingly, this approach advantageously allows a payload to be recovered from a portion of the data-bearing medium without the need to capture the entire data-bearing medium. Such aspects, among other things, increase the simplicity of the operation and lead to an enjoyable experience through flexibility as to what capture devices can be used.

In one example in accordance with the present disclosure, a method for forming a data-bearing medium is provided. The method comprises setting variables associated with the data-bearing medium, the variables comprising a bit length of a payload, a row-to-row offset and an interleave period, identifying a standard form of the payload, the standard form being a circularly shifted version of the payload, generating a phase code based on the variables, and arranging rows of the data-bearing medium with the standard form of the payload and the phase code based on the interleave period.

In another example in accordance with the present disclosure, a method for recovering a payload from a data-bearing medium is provided. The method comprises decoding data-bearing elements in the data-bearing medium into an array of bits, selecting a set of rows of the array of bits from a number of sets of rows of the array of bits, identifying a version of phase code corresponding to the set of rows of the array of bits, determining a standard form of the version of the payload, determining the phase code of the version of the phase code, determining a circular shift between the phase code and the version of the phase code, and shifting the standard form of the version of the payload by the circular shift to recover the payload.

In a further example in accordance with the present disclosure, a data-bearing medium is provided. The data-bearing medium comprises an array of data-bearing elements, wherein the array of data-bearing elements represents an array of bits, wherein a phase code is generated based on variables associated with the data-bearing medium, the variables comprising a bit length of a payload, a row-to-row offset and an interleave period, wherein rows of the array of bits are arranged with a standard form of the payload and the phase code based on the interleave period, and wherein positions of the bits in each row of the array of bits are circularly shifted from positions of the bits in an immediately preceding row based on the row-to-row offset.

FIG. 1 illustrates a data-bearing medium 100, such as a data-bearing optical, magnetic, or atomic medium or a data-bearing image in accordance with an implementation. The data-bearing medium 100 may comprise an image with highlight areas and shadow areas, and data may be carried on black clusters in highlight areas of the image, and on white clusters in the shadow areas. It should be readily apparent that the data-bearing medium 100 represents a generalized depiction and that the medium may be modified or rearranged without departing from a scope of the present disclosure.

In one implementation, data (e.g., that may be referred to as a payload) may be encoded in an array of data-bearing elements in the data-bearing medium 100 that can be read by a data recovery system. The data-bearing medium 100 may comprise data-bearing halftones, graphical alpha-numerics, barcodes or other examples of data-bearing images, where the data-bearing elements may be symbols that encode the payload. In an example, the payload may be in the form of a string of bits (e.g., a bit code), such as ones and zeros. Each bit in the string may be encoded in one data-bearing element of the data-bearing medium (e.g., encoded in one symbol in a data-bearing image). Further, the data-bearing medium 100 such as data-bearing halftone images may be used to encode a payload P in an original grayscale image (e.g., a source image), such as a photograph, graphic, text, or an area, such as the background of a page.

In another implementation, the payload may be repeated throughout the data-bearing medium 100. The repeating payload may have a certain number of bits (B). One bit may be assigned to every cell in the image, and each cell may be data-bearing or non-data-bearing. For each line of cells in the image, the payload may be repeated until the end of the line. In one implementation, the payload string of bits may be encoded using a string of bits formed by circularly shifting (e.g., by right circularly shifting) the bit positions of the bits in payload string of bits.

The payload may be recovered from a region 110 that is a portion (e.g., a subset), such as a crop, of data-bearing medium 100, e.g., without any knowledge of the original image. In one implementation, the region 110 may be an example of a segmentation of a certain size (e.g., 23×23) cell area in a classical halftone screen that may represent the area of the captured window of the encoded image. In one example, the region 110 may be the size of an image-capture area of an image-capturing device, such as a CID (charge injection device) camera, used by a payload recovery system that can be used to recover the payload from the data-bearing medium 100. Alternatively, the size of the region 110 may be equal to or greater than the image of the data-bearing medium 100.

The region 110 may include highlight modules (e.g., highlight cells) 130 and shadow cells 120. For example, each cell in the region 110 may correspond to a data-bearing element, such as a data-bearing symbol, e.g., that may encode one bit. The highlight cells 130 may be represented by gray squares and shadow cells 120 may be represented by white cells. In light image areas, the shadow cells 120 may be completely white and thus unable to carry any data, while the highlight cells 130 may be rendered as small black clusters capable of carrying data. In dark image areas, the highlight cells 130 may be completely black while the shadow cells 120 rendered as small white clusters can carry data. It should be readily apparent that while the captured window 110 cells are displayed as a checkerboard (e.g., the shadow cells 120 and highlight cells 130), the rest of the data-bearing medium 100 illustrated in FIG. 1 includes cells across the entire image, and only the captured region 110 cells has been shown and described for simplicity.

In one implementation, the region 110 may have a 23×23 cell area of length (L) 150 of 23 symbols long and a width (W) 140 of 23 symbols wide. In light portions of a data-bearing halftone image, the shadow cells 120 may be completely white and thus unable to carry any data, while the highlight cells 130 may be rendered as small black clusters capable of carrying data by means of shifting, for example. In dark areas of a data-bearing halftone image, the highlight cells 130 may completely black and unable to carry any data, while the shadow cells 120 may be rendered as small white clusters that can carry data, for example. Therefore, in light areas or dark areas of a data-bearing halftone image no more than half of the cells (e.g., symbols) may encode data, for example.

FIG. 2A illustrates an example implementation of how a payload string of bits P=1100 (e.g. where B=4) may be right circularly shifted, where the "shift" is the number of bit positions by which the bits in the payload are right circularly rotated. FIG. 2A provides each shifted version of the payload. It should be noted that the bit positions $b_3$ to $b_0$ respectively denote the most to the least significant bit positions in FIG. 2A, where bit position $b_3$ is the most significant bit position in FIG. 2A and bit position $b_0$ is the least significant bit position in FIG. 2A. In an example, the string of bits 1100 may be an encrypted version of the payload.

For each right circular shift of one bit, each bit may be moved one bit position to the right, and the bit in the last position on the right (e.g., in the rightmost position) may be moved to the first position (e.g., the leftmost position). For a shift of two, the bits 10 respectively in the positions $b_2$ and $b_1$ in the payload 1100 are respectively moved to the bit positions $b_0$ and $b_3$. For each successive line, the payload may be circularly shifted relative to the row above it. In one implementation, the line may refer to row-wise strings. In another implementation, the line may refer to column-wise strings.

In one implementation, the payload string of bits may be encoded using the shifted version of the payload having the lowest decimal value of all possible shifts of the payload string of bits. For example, the shifted version of the payload having the lowest decimal value of all possible shifts of the payload string of bits may be referred to as the standard form (e.g., standard phase) S of the payload. Therefore, for the example of FIG. 2A, the payload P=1100 may be encoded using the shifted version S=0011, corresponding to a right circular shift of two bit positions. As shown in FIG. 2A, each shift causes the bit value in every bit position to change, and therefore each shifted bit string may have a different decimal value in FIG. 2A. Further, each shifted bit string has B=4 bits of payload known to both encoder and decoder in FIG. 2A. In one implementation, the shifted versions of some payloads may have the same value. A payload P=1010 is one such example, as is shown in FIG. 2B. The standard form S=0101 may be achieved with a right circular shift of 1 or 3, and it does not matter which one is used to encode the payload P=1010 in FIG. 2B. It should be noted that the number of independent strings that can be represented by B bits is less than 2 to the power B.

FIG. 3 illustrates an example of the right circular shifts of a 16-bit payload (e.g., for a payload having B=16 bits) and the decimal value for each shift. For example, the bit string having a shift of zero (e.g., the bit string 1011001000001010) may be the payload, and the payload may be encoded in a circularly shifted version of the payload having the lowest decimal value, e.g. the bit string 0000010101011001 having a shift of nine, of all possible shifts of the payload. The bit string 0000010101011001 is the standard form (S) of the payload (P) bit string 1011001000101010. The bit positions b15 to b0 respectively denote the most to the least significant bit positions in FIG. 3, where bit position b15 is the most significant bit position and bit position b0 is the least significant bit position. The shifted version of the payload, e.g., the standard form S=0011 from FIG. 2 or the standard form S=0000010101011001 from FIG. 3, may be repeated in a two-dimensional array of bits, and the bits in each successive row of the two-dimensional array of bits may be right circularly shifted from the bits in an immediately preceding row by a right circular shift that is an integer multiple of the right circular shift (e.g., a right circular shift of two bit positions for the example of FIG. 2 or a right circular shift of nine bit positions for the example of FIG. 3) that produced the shifted version of the payload.

Figure 4:
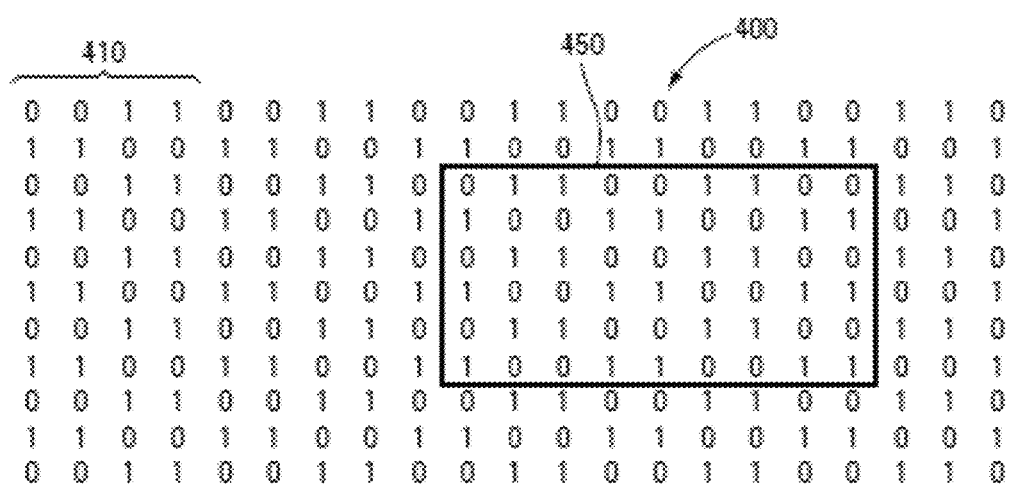
FIG. 4 illustrates an example of a two-dimensional array of data bits.

FIG. 4 illustrates an example a two-dimensional array 400 of data bits in accordance with an implementation. The string 410 (e.g., a certain number of the bits of the array 400) may be a unit string, for example, of bits 0011. The string 410 repeated throughout the array 400. The string 410 is a right-shifted version of the payload 1100, and is obtained by right shifting the bits of payload 1100 by two bit positions to the right, as discussed above in conjunction with FIG. 2. The string 410 is the standard form S=0011 of the payload P=1100. It should be noted that the standard form may have all of bits of the payload, but in different order.

Each row of bits in the two-dimensional array 400 are right circularly shifted from the bits in an immediately preceding row by a right circular shift that may an integer multiple of the right circular shift by which the bits in the string 410 are shifted from the payload bits. For example, each row of bits in the two-dimensional array 400 may be right circularly shifted from the bits in an immediately preceding row by a number of bit positions that may be an integer multiple of the number of bit positions by which the bits in the standard form S of the payload P are right circularly shifted from bits in the payload P.

Figure 5:
FIG. 5 illustrates an example of a data-bearing medium.

FIG. 5 illustrates an example data-bearing medium 500, representing the payload P consisting of B bits in a two-dimensional array of one-bit symbols, in accordance with one implementation. More specifically, FIG. 5 depicts a sample image (e.g., the image 100 in FIG. 1) encoded by an exemplary method disclosed herein. The data-bearing medium 500 represents the image with bit positions superimposed on highlight cells (e.g., the highlight cells 130 in FIG. 1) and shadow cells (e.g., the shadow cells 120 in FIG. 1). For example, the numbers in the cells in the data-bearing medium 500 may give the positions of the bits encoded in those cells. The numbers may represent payload bit position (B−2, . . . , 1, 0).

In one implementation, the per-row circular shifts (D) may be fixed. D may be the row-to-row offset of the payload in the image (e.g., the row-to-row right circular shift in bit positions in a two-dimensional array of bits 400), and C can be a circular phase representing the number of bit positions from which the bits in the standard form of the payload are shifted from the bits in the payload. In addition, a phase code interleave period (V) may be defined. Further, a number of bits, c, required to represent the circular phase C may be calculated. In one implementation, c may be calculated based on the length of the payload. More specifically, $c=\log_2 B$, which is then rounded up to the closest integer value.

In one implementation, the data-bearing medium 500 may generate a phase code representation (U) of the circular phase C. U may be defined to be a B-bit code. In such implementation, there may be a variety of ways to generate the B-bits of U. In one example, each of the c bits twice for each bit of C may be repeated and then the first bit can be used to start again and continue until all B bits are filled. In another example, portions of the bits in U may be used with the 1's complement of the corresponding bit position in S to amplify the different from S. In a further example, where c is off, C may be repeated to fill all B bits. If C is even, one bit may be padded with the one's complement of the corresponding bit position in S and those c+1 bits may be repeated to fill all B bits.

By way of example, FIG. 5 illustrates a case where B=17, D=2, and V=3. The row of the phase code is interleaved with the rows of the payload. Every row of phase code is followed by (V−1) rows of payload. For example, the first two rows represent bit positions of the payload in standard form, and the third row represent bit positions of the phase code (U). Further, each row is circularly shifted by D=2 more bit positions than the row above it regardless of payload or phase code.

In another implementation, the phase code may comprise a code shorter than B bits. In such implementation, the phase row may be completed by repeating each of the c bits twice for each bit of C. Further, (V−1) rows of S are filled repeatedly, followed by one row of the phase code, and with each payload row circularly shifted by D more bits that the row above, and each phase row shifted by the deviation C from its standard form. In a further implementation, the phase rows may have no predefined shift relationship with the other rows, or even with each other, and are formed by simply repeating the c bits representing the shift required to map the payload to its original form.

Figure 6:
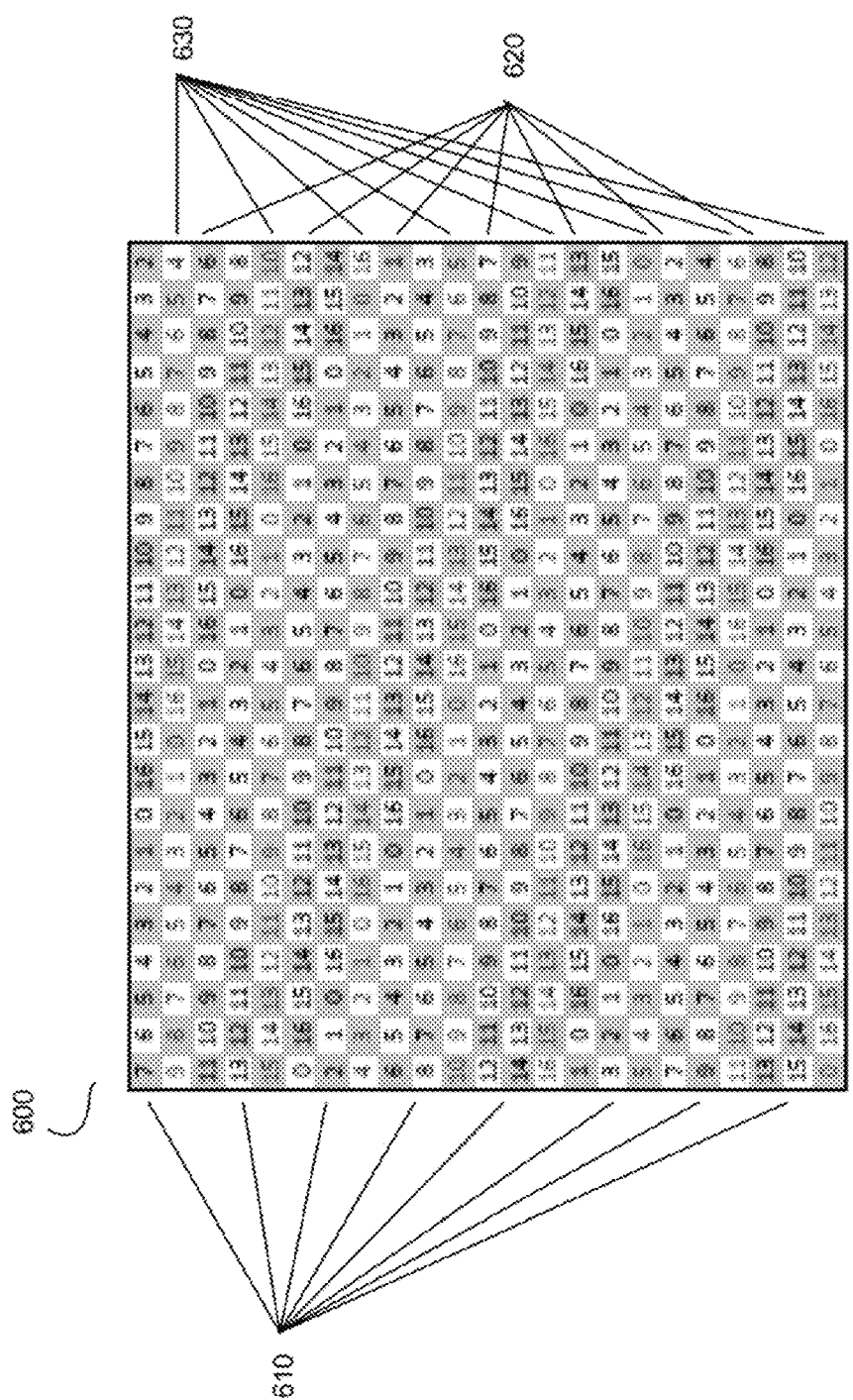
FIG. 6 illustrates an example illustrating the positions of the bits in the two-dimensional array of data bits in FIG. 4.

FIG. 6 illustrates an example data-bearing medium 600 in accordance with one implementation. The data-bearing medium 600 represents a sample crop of an image (e.g., the region 110 in FIG. 1) encoded by an exemplary method disclosed herein. More specifically, the data-bearing medium 600 may represent a cropped image of FIG. 5 with bit positions superimposed on the highlight cells 130 and the shadow cells 120. More specifically, FIG. 6 uses the encoded image from FIG. 5, and depicts a 23×23 capture of the data-bearing medium 500. The correct bit positions of the payload in standard form are indicated in black, and the correct bit positions of the phase code rows are indicated in red. This information may not be known to the recovery system but is shown for reference. Similar to FIG. 5, in this example, B=17, D=2, and V=3. Accordingly, the number of bits B in the payload (e.g., and thus at least a shifted version, such as the standard version of, the payload) is 17 and the row-to-row right circular shift is 2.

The phase code interleave period of the data-bearing medium 600 is three. Accordingly, the data-bearing medium 600 has three candidate sets (e.g., the candidate phase code sets 610, 620 and 630) of rows where the phase code is present. In each case, the rows in-between the candidate phase code rows are assumed to be payload rows. In order to identify the correct set of the phase code for the data-bearing medium 600, the rows may be evaluated. Further, the corresponding bit positions may be averaged, and the uncertainties and confidence may be generated. In one implementation, the phase code with the highest confidence score may be identified as the correct phase code for the data-bearing medium 600. For instance, in the present example of FIG. 6, the correct set of the phase code is the set 620. Further, in one implementation, the set 620 phase code rows may be averaged to form a shifted U' code. The relative shifts may be calculated as $D*V=2*3=6$ bit positions.

The data-bearing medium 600 has W=23 cells (e.g., symbols) in the row direction and L=23 cells (e.g., symbols) in the column direction, which is greater than B, and there is one bit per cell, each row has 23 cells (e.g., symbols), which is greater than B. This means, for example, that the number of symbols that encode the payload does not exceed the number of symbols in the cropped region in the row and/or column direction, e.g., where each symbol encodes a bit.

Figure 7:
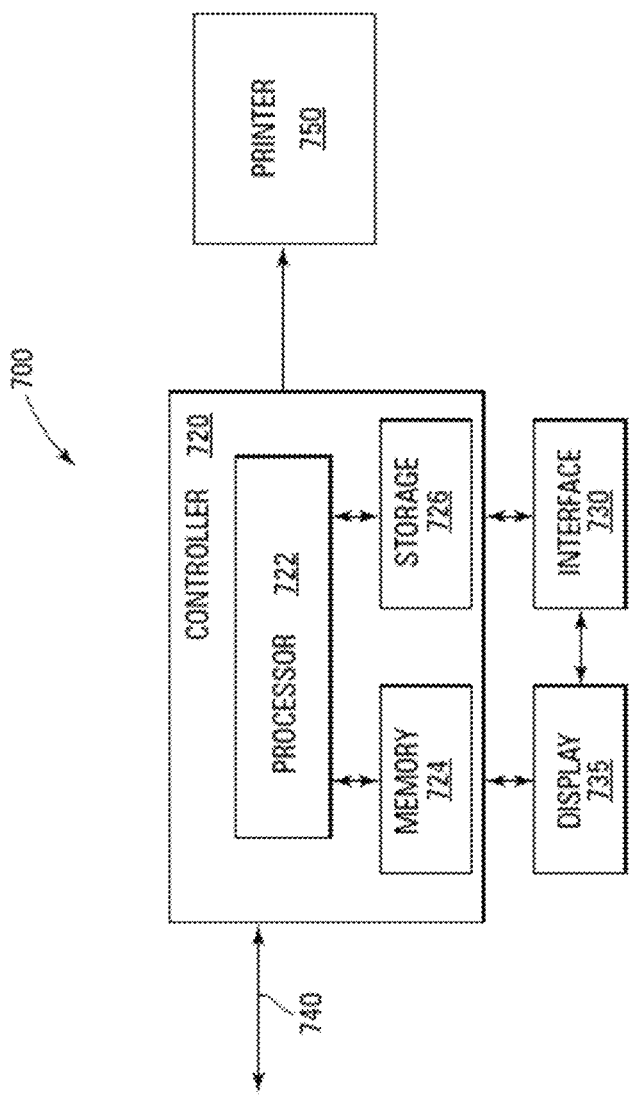
FIG. 7 illustrates a block diagram of an example of a data-bearing-medium-generation system.

FIG. 7 illustrates a block diagram of an example of a data-bearing-medium-generation system 700 that may generate data-bearing media, such as the data-bearing medium 100 in accordance with an implementation. For example, the data-bearing-medium-generation system 700 may generate the data-bearing medium disclosed herein. The system 700 may include a controller 720 that may allow the system 700 to perform the methods and functions disclosed herein for generating (e.g., automatically) the data-bearing media disclosed herein. In one implementation, one or more operations are performed by a device, such as the system 700, in response to an event without user intervention, and the one or more operations may be taken as being performed automatically.

The controller 720 may include a processor 722 for processing machine-readable instructions, such as processor-readable (e.g., computer-readable) instructions. The machine-readable instructions may configure the processor 722 to allow the controller 720 to allow the system 700 to perform the methods and functions associated with generating (e.g., automatically) the data-bearing media disclosed herein.

The machine-readable instructions may be stored in a memory 724, such as a non-transitory computer-usable medium, coupled to the processor 722 and may be in the form of software, firmware, hardware, or a combination thereof. In a hardware solution, the machine-readable instructions may be hard coded as part of the processor 722, e.g., an application-specific integrated circuit (ASIC) chip. In a software or firmware solution, the instructions may be stored for retrieval by the processor 722. Some additional examples of non-transitory computer-usable media may include static or dynamic random access memory (SRAM or DRAM), read-only memory (ROM), electrically erasable programmable ROM (EEPROM) memory, such as flash memory, magnetic media and optical media, whether permanent or removable, etc. Some consumer-oriented computer applications are software solutions provided to the user in the form of downloads, e.g., from the Internet, or removable computer-usable non-transitory media, such as a compact disc read-only memory (CD-ROM) or digital video disc (DVD).

The controller 720 may include a storage device 726, such as a hard drive, removable flash memory, etc. The storage device 726 may store digital image data (e.g., bitmaps, PDFs, TIFFs, JPEGs, etc.) corresponding to (e.g., representing) the data-bearing media disclosed herein. The storage device 726 may store encryption keys, such as PKI and IBE encryption keys to encrypt data to be encoded into the data-bearing media.

A human-machine interface 730 may be coupled to the controller 720. The interface 730 may be interface with a number of input devices, such as a keyboard and/or pointing device, including, for example, a mouse. The interface 730 may interface with a display 735 that may include a touch-screen that may function as an input device. The controller 720 may be coupled to a data network, such as the Internet, a Local Area Network (LAN), etc., and/or a computer via an interface 740. The system 700 may include a printer 750 coupled to the controller 720. The printer 750 may be used to print digital image data, corresponding to data-bearing media, as hard-copy images. The printer 750 may be replaced with apparatus for creating data-bearing elements on atomic data-bearing media, magnetic data-bearing media, optical data-bearing media, etc., for example.

The processor 722, memory 724, and storage 726 may be part of a computer, such as a personal computer, for example. As such, the machine-readable instructions may configure the processor 722 to allow a computer to create electronic versions of data-bearing media. For example, the computer may be coupled to a printer, such as the printer 750, that can print the electronic versions of data-bearing media as hardcopy images.

It should be recognized that the functionality of the various block components described with reference to FIG. 7 may not necessarily be segregated into distinct components or component portions of a data-bearing-media-generation system. For example, a single component or component portion of a data-bearing-media-generation system could be adapted to perform the functionality of more than one block component of FIG. 7. Alternatively, one or more components or component portions of a data-bearing-media-generation system could be combined to perform the functionality of a single block component of FIG. 7.

Figure 8:
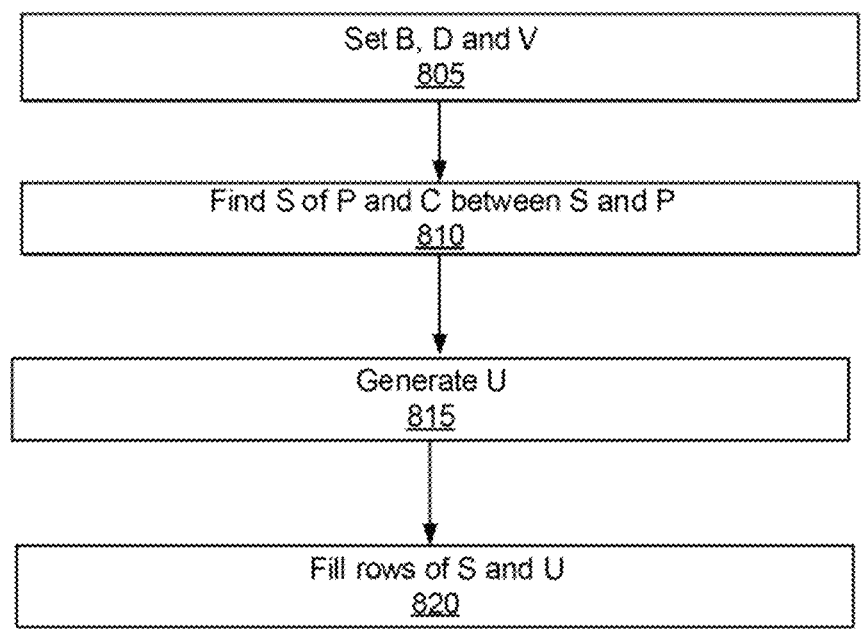
FIG. 8 illustrates a flowchart of an example of a method for automatically forming a data-bearing medium.

Turning now to the operation of the data-bearing medium 100, FIG. 8 illustrates an example process flow diagram 800 in accordance with an implementation. The process 800 depicts an example of a data-bearing-medium-generation system 700 that may generate data-bearing media, such as the data-bearing medium 100. The machine-readable instructions may instruct the processor 722 to allow the data-bearing-media-generation system 700 to perform the process 800 as illustrated by the flowchart in FIG. 8. In one implementation, the data-bearing-medium-generation system 700 may perform the process 800 in response to receiving an instruction from a user to form a data-bearing medium.

The process 800 may begin at block 805, where an instruction, e.g., from a user is received to form a data-bearing medium. In particular, this process may involve setting the payload bit length B, row-to-row offset D, phase code representation method, and interleave period V. In one implementation, B, D, and V are known to the recovery system, which will be discussed in more detail in reference to FIG. 9. In another implementation, B, D, and V may be published widely (e.g., a public key). In a further implementation, B, D, and V may be product/item specific and may be linked to a product/item identifier. In one implementation of halftone symbols. B may be odd, D may be even, and V may be odd.

At block 810, the controller 720 may find the standard form (S) of the payload (P) and the circular phase (C) between the standard form and payload. In particular, the standard form corresponds to the shifted bit sequence of the payload that yields the smallest value. Further, using the convention that the standard phase corresponds to the circular phase that yields the smallest version of the shifted code, the circular phase may be determined. In one implementation, the string of bits may be an encrypted version of the payload that is encrypted by the controller 720. For example, the controller 720 may receive the payload and encrypt the payload.

At block 815, the controller 720 may generate the phase code (U). As described above in more detail in reference to FIG. 5, the phase code U may be generated in a variety of ways. In one example, each of the c bits may be repeated twice for each bit of circular phase, and then the first bit can be used to restart and continue until all B bits are filled. In another example, portions of the bits in the phase code may be used with the one's complement of the corresponding bit position in the standard form to amplify the difference from the standard form. In a further example, it may first be determined whether c is odd or even. If c is odd, the circular phase may be repeated to fill all B bits. If c is even, one bit may be padded with the one's complement of the corresponding bit position in the standard form, and the c+1 bits may be repeated to fill all B bits.

At block 820, the controller 720 may repeatedly fill (V−1) rows of the standard form, followed by one row of the phase code, with each row circularly shifted by the row-to-row offset (D) more bits that the row above. In particular, this process may involve arranging the two-dimensional array of bits so that the bits in each successive row of the two-dimensional array of bits are circularly shifted (e.g., right circularly shifted) from the bits in an immediately preceding row. More specifically, the process involves repeating the payload across each line where each successive row is circularly shifted relative to the row above it. Accordingly, the rows of payload and the phase code are interleaved.

Alternatively, in another implementation, where the length of the phase code is less than B-bits, at block 820, the controller 720 may repeatedly fill (V−1) rows of the standard form, followed by one row of the phase code, with each payload row circularly shifted by the row-to-row offset (D) more bits that the row above, and each phase row shifted by the deviation C from its standard form.

Figure 9:
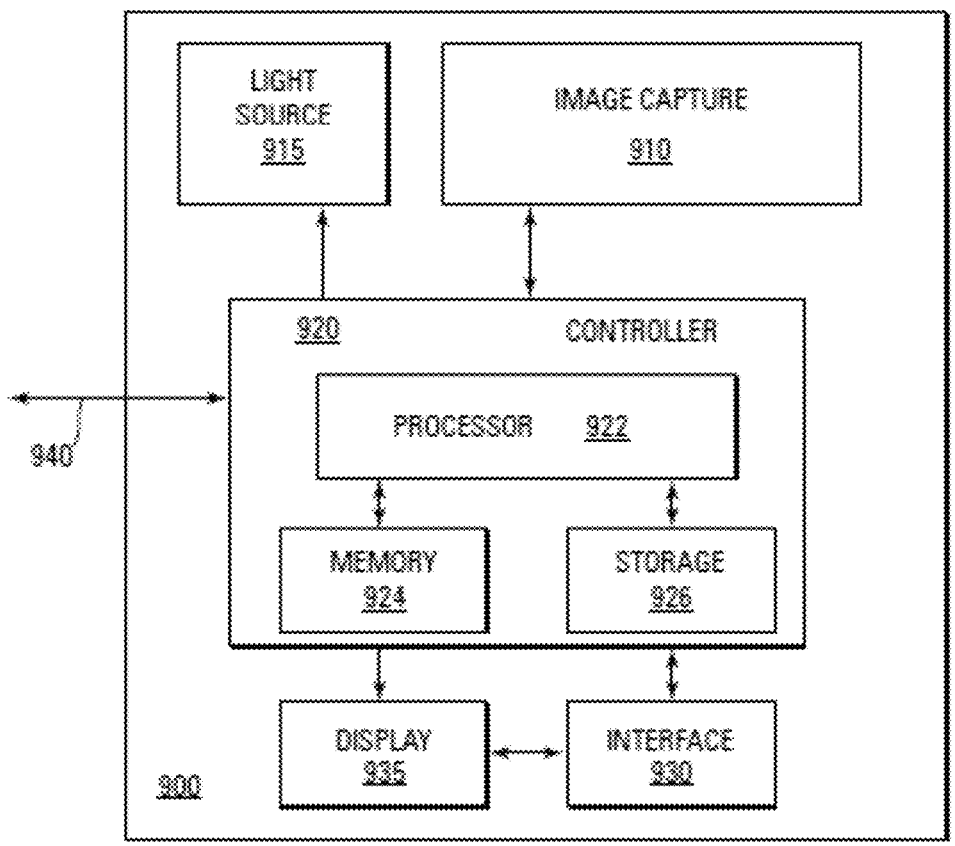
FIG. 9 illustrates a block diagram of an example of a data-recovery system.

FIG. 9 illustrates a block diagram of an example of a data-recovery system 900 (e.g., a data-bearing-medium reader) to recover data, e.g., a payload, from a data-bearing medium, such as the data-bearing medium 100. For instance, the data-recovery system 900 may recover data from the examples of the data-bearing media disclosed herein, such as data-bearing halftones. The system 900 may be a mobile (e.g., handheld) device that may be moved relative to a stationary data-bearing medium or a stationary or fixed-position device that remains stationary or fixed while a data-bearing medium is moved past it.

The system 900 may capture a portion of a data-bearing medium, such as the region (e.g., cropped region) 110 that is a portion (e.g., a crop) of the data-bearing medium 100 in FIG. 1. The number of data-bearing elements in a cropped region of a data-bearing medium (e.g., the region 110) is L×W, where L is the number of data-bearing elements in the crop in the column (e.g., vertical) direction of the crop and W is the number of data-bearing elements in the crop in the row (e.g., horizontal) direction of the crop.

The system 900 may include a data-bearing-media capturing device, e.g., an image-capturing device 910, such as a camera (e.g., a CID camera), or a scanner, to capture a data-bearing medium, e.g., an image of a data-bearing medium. The image-capturing device 910 may convert the captured image into digital image data (e.g., a bitmap, PDF, TIFF, JPEG, etc.), for example. In an example, a captured area of the data-bearing-media capturing device may be the size of the region 110 in FIG. 1. In one implementation, the capturing device 910 may capture (e.g., detect) data-bearing elements on atomic data-bearing media, magnetic data-bearing media, optical data-bearing media, etc.

In an example, the system 900 may include an illumination source, such as a light source 915, to illuminate a data-bearing medium prior to reading the data-bearing medium. For example, the light source 915 may illuminate a portion of a data-bearing medium, such as the region 110.

The system 900 may include a controller 920 (e.g., a decoder) that may allow the system 900 to perform the methods and functions disclosed herein for recovering data, such as a payload, from a data-bearing medium, e.g., from a portion of the data bearing image. The functionality of the image-capturing device 910 that converts the captured image of a data-bearing medium into digital image data, representing the data-bearing medium may be incorporated in the controller 920.

The controller 920 may include a processor 922 for processing machine-readable instructions, such as processor-readable (e.g., computer-readable) instructions. The machine-readable instructions may instruct the processor 922 to allow the controller 920 to allow the system 900 to perform the methods and functions disclosed herein associated with recovering a payload from a data-bearing medium, e.g., from a portion a data-bearing medium. For example, the machine-readable instructions may instruct the controller 920 to allow the system 900 to perform the methods and functions associated with recovering the payload of a data-bearing medium, e.g., from a captured region of the data-bearing medium that may be a portion of the data-bearing medium without reading the entire data-bearing medium.

The machine-readable instructions may be stored in a memory 924 coupled to the processor 922, such as a non-transitory computer-usable medium, and may be in the form of software, firmware, hardware, or a combination thereof. In a hardware solution, the machine-readable instructions may be hard coded as part of the processor 922, e.g., an application-specific integrated circuit (ASIC) chip. In a software or firmware solution, the instructions may be stored for retrieval by the processor 922.

The controller 920 may include a storage device 926, such as a hard drive, removable flash memory, etc. The storage device 926 may store decryption keys, such as PKI (Public Key Infrastructure) and IBE (Identity Based Encryption) decryption keys, to respectively decrypt data decoded from a data-bearing medium. For example, the controller 920 may decrypt a recovered payload that may be encrypted.

A human-machine interface 930 may be coupled to the controller 920. The interface 930 may interface with a number of input devices, such as a keyboard and/or pointing device, including, for example, a mouse. The interface 930 may interface with a display 935 that may include a touch-screen that may function as an input device. The controller

920 may be coupled to a data network, such as the Internet, a Local Area Network (LAN), etc., and/or a computer via an interface 940.

It should be recognized that the functionality of the various block components described with reference to FIG. 9 may not necessarily be segregated to distinct components or component portions of a data-recovery system. For example, a single component or component portion of a data-recovery system could be adapted to perform the functionality of more than one block component of FIG. 9. Alternatively, one or more components or component portions of a data-recovery system could be combined to perform the functionality of a single block component of FIG. 9.

The processor 922, memory 924, storage device 926, and/or human-machine interface 930 may be implemented in a computer, for example, and the capturing device (e.g., image-capturing device 910) may be coupled to the computer, for example.

Figure 10:
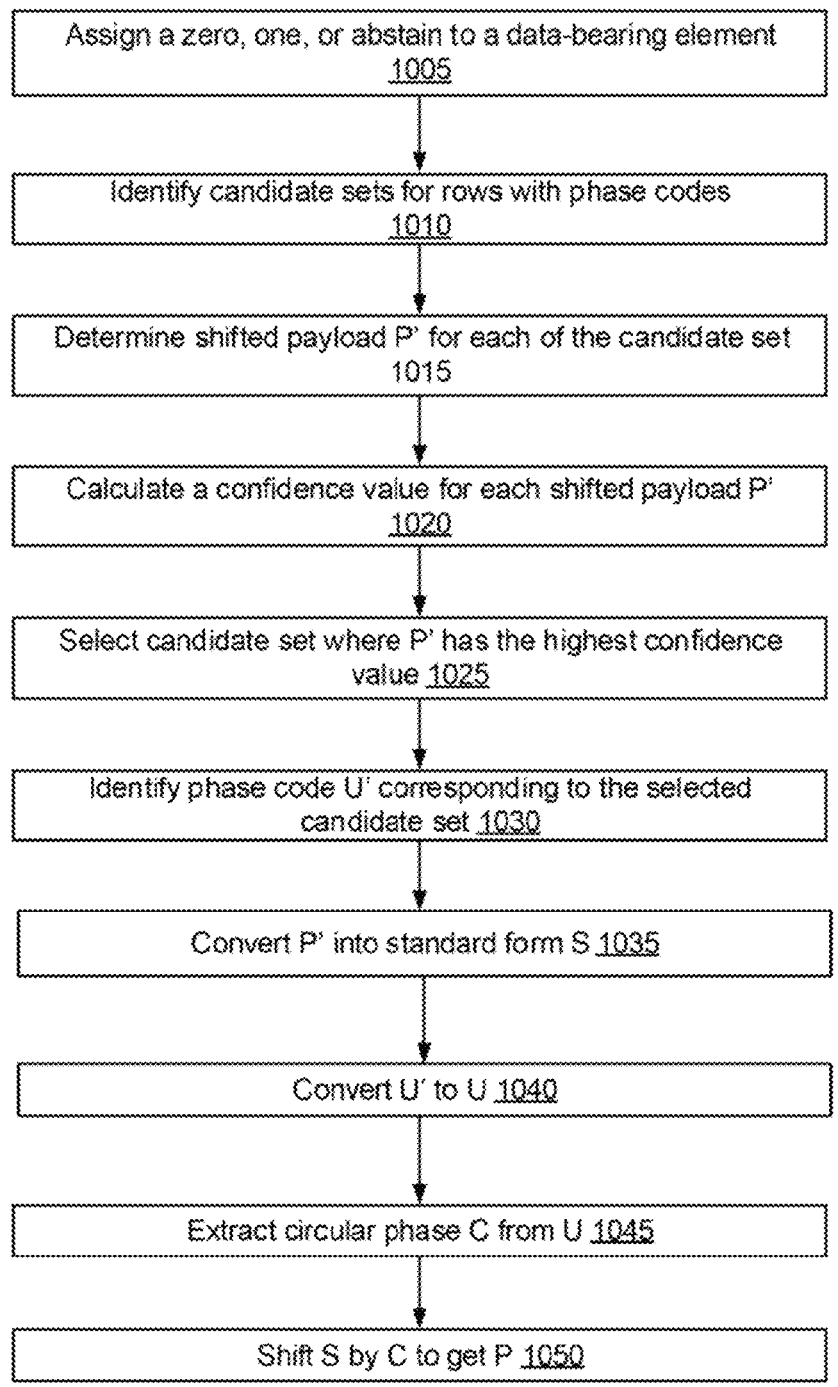
FIG. 10 illustrates a flowchart of an example of a method for automatically recovering data from a data-bearing medium.

Turning now to the operation of data-recovery system 900, FIG. 10 illustrates an example process flow diagram 1000 in accordance with an implementation. The process 1000 depicts an example of the data-recovery system 900 that may find the payload P in data-bearing media, such as the data-bearing medium 100. The machine-readable instructions may configure the processor 922 to allow the controller 920 to allow data-recovery, to allow the system 900 to perform the process 1000 of automatically recovering a payload from a data-bearing medium, such as data-bearing medium 100 in FIG. 1, as illustrated by the flowchart in FIG. 10, for example. The data-recovery system 900 may perform the process 1000 in response to capturing (e.g., an image of) at least region 110 of data-bearing medium 100.

In one implementation, B, the number of bits in the payload, may be an input to the system 900 by the data-bearing-medium-generation system 700 and stored in the storage 926. In addition or alternatively, the row-to-row offset D, phase code representation method and interleave period V may be input to the system 900 by the data-bearing-medium-generation system 700 and stored in the storage 926. The controller 920 may know a priori that an image is a data-bearing medium having a circular code. This information may be input to system 900 by a user. Alternatively, the system 900 may be dedicated to handling data-bearing media having circular code, for example. In addition, the controller 920 may need to know the orientation of the image (e.g., the direction of top, bottom and/or sides). For example, the image may need to be oriented in a certain way relative to the system 900. For example, the system 900 may instruct the user to orient the image or the system 900, e.g., via the display 935, a label fixed to system 900, etc.

The process 1000 may begin at block 1005, where the controller 920 may receive instructions to initiate the process to recover data-bearing elements in the data-bearing medium into an array of bits corresponding to the portion of the data-bearing medium. In particular, this process may involve assigning a zero, one, or abstain to a data-bearing element. In one implementation, the controller 920 may assign an abstain label to any data-bearing element that is degraded due to damage, noise, or otherwise uncodable. Alternatively or in addition, the controller 920 may exclude the data-bearing elements that are assigned abstain.

For example, a candidate shift may be tested, and thirteen samples of payload symbol representing a bit value of one may be recovered in the presence of noise. In this example seven symbols may be determined by the recovery system to be relatively noise-free and may be assigned the value one. The remaining six symbols may be degraded by noise resulting in recovery values zero for four of the symbols and one for two of the symbols. Without using abstentions, the average recovery value for this bit may be $9/13 \approx 0.69$, whereas if the recovery system assigns abstentions to the six noisy symbols and excludes the noisy symbols, the resulting average may be $7/7=1.00$.

At block 1010, the candidate sets (e.g., sets 610, 620 and 630 as shown in FIG. 6) for phase rows are identified. In particular, the number of candidate rows is equal to V. At block 1015, a shifted payload P' for each of the candidate row is determined, and at block 1020, a confidence value for each shifted payload P' is calculated.

In one implementation, a confidence level may be computed as $CL=1-(2/B)\Sigma u_j$, where the summation is from $j=0, 1, 2, \ldots, (B-1)$. The uncertainty, $u_j$, is the absolute value of the difference between the estimate of bit position j and the average. The average may be determined by first eliminating the candidate rows, and then, computing an average for each bit position from the remaining D-shifted rows. Further, an average of all non-abstained values may be found for each bit position $\{b_{B-1}, \ldots, b_1, b_0\}$. If the average value is less than 0.5, a value of zero may be assigned, and if the average value is greater than or equal to 0.5, a value of one may be assigned. In one implementation, a bit's uncertainty may range from 0 to 0.5. In another implementation, the confidence levels may be multiplied by 100 to be expressed as percentages.

At block 1025, the candidate set where P' has the highest confidence level is selected. At block 1030, the corresponding phase code U' is identified. For each bit position $\{b_{B-1}, \ldots, b_1, b_0\}$, an average for of all non-abstained values is calculated. In the event that the average is less than 0.5, a value of 0 is assigned. In the event that the average is greater than or equal to 0.5, a value of 1 is assigned.

At block 1035, the controller 920 may then determine the standard form (e.g., the standard phase) S of the selected payload P' by finding the minimum binary number value of the binary strings representing all B circular shifts of P'.

At block 1040, the controller 920 converts U' to U by circularly shifting U' by the same amount as in block 1035 to convert P' to the standard form. At block 1045, the circular phase C is extracted from the phase code U. At block 1050, the standard form S is circularly shifted by C to get the payload P.

In another implementation, where the length of the phase code is less than B-bits, the rows containing the phase codes may be determined by estimating which candidate row set exhibits the shortest period. In particular, this process may involve averaging spectral profiles of all lines in a set or simply evaluating the average per-line interval T yielding the maximum correlation between the line and a length-T sequence [meant$\{r_0+T^*t\}$, meant$\{\Sigma t\, r_0+T^*t\}, \ldots$, meant$\{r(T-1)+T^*t\}$], where r indexes per-row samples.

Figure 11:
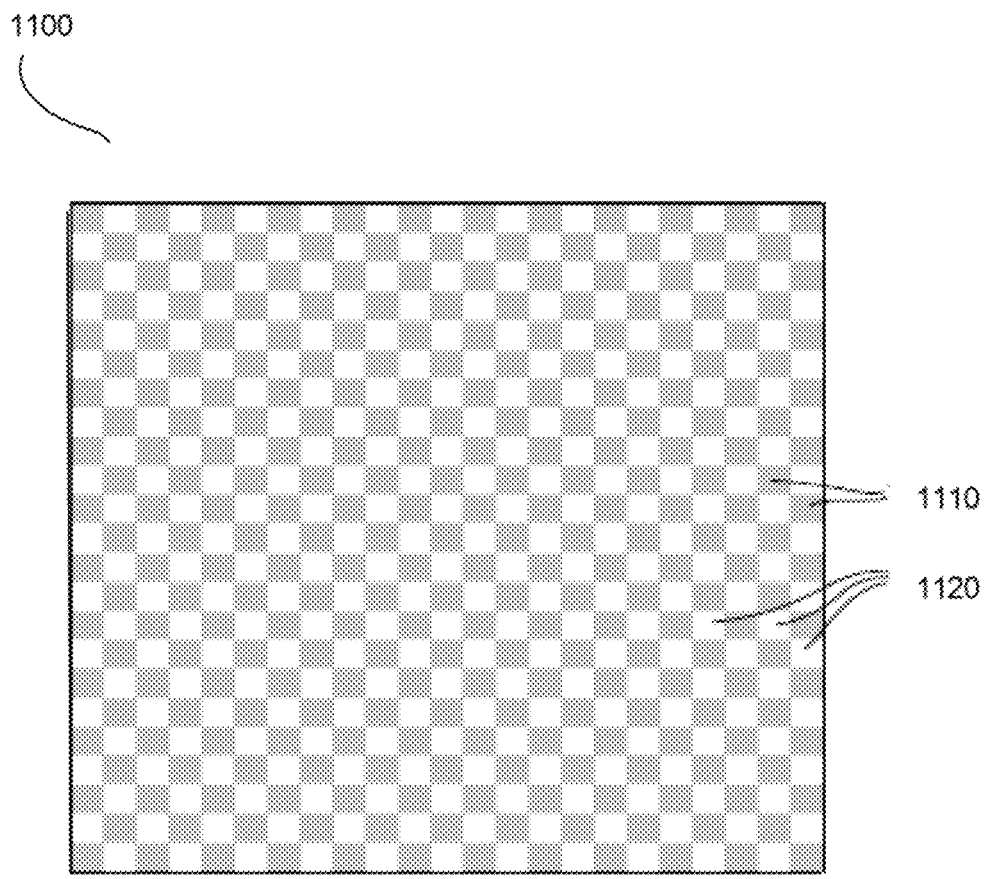
FIG. 11 illustrates an example of a cropped region of an encoded data-bearing halftone image.

FIG. 11 illustrates a cropped region 1100 that represents a captured portion of an encoded data-bearing halftone image. For example, the region 1100 may correspond to the region 110 in FIG. 1 and may be a portion of data-bearing medium 100. The region 1100 may include highlight modules (e.g., highlight cells) 1110 and shadow cells 1120. For example, each cell in the region 1100 may correspond to a data-bearing element, such as a data-bearing symbol, e.g., that may encode one bit. For example, the region 1100 may be L=23 symbols long and W=23 symbols wide.

In light portions of a data-bearing halftone image, the shadow cells 1120 may be completely white and thus unable to carry any data, while the highlight cells 1110 may be rendered as small black clusters capable of carrying data by means of shifting, for example. In dark areas of a data-bearing halftone image, the highlight cells 1110 may completely black and unable to carry any data, while the shadow cells 1120 may be rendered as small white clusters that can carry data, for example. Therefore, in light areas or dark areas of a data-bearing halftone image no more than half of the cells (e.g., symbols) may encode data, for example.

Figure 12:
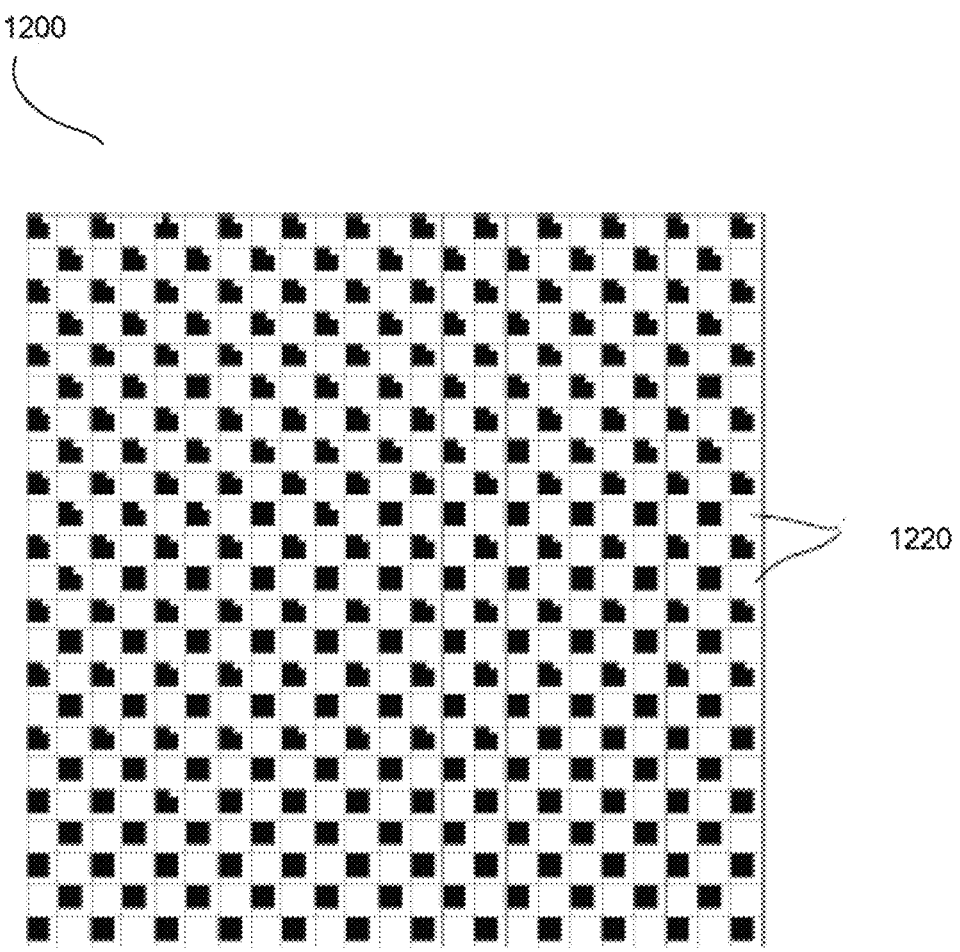
FIG. 12 illustrates an example of a cropped region cropped from an all highlight portion of a data-bearing halftone image.

Using the halftone cell pattern in the example of FIG. 11, an all highlight region 1200 may be captured from an all highlight portion of a data-bearing halftone image, as shown in the example of FIG. 12, where the boundaries of the halftone cells are superimposed. For example, each of the shadow cells 1220 may be all white and thus incapable of carrying data.

Figure 13:
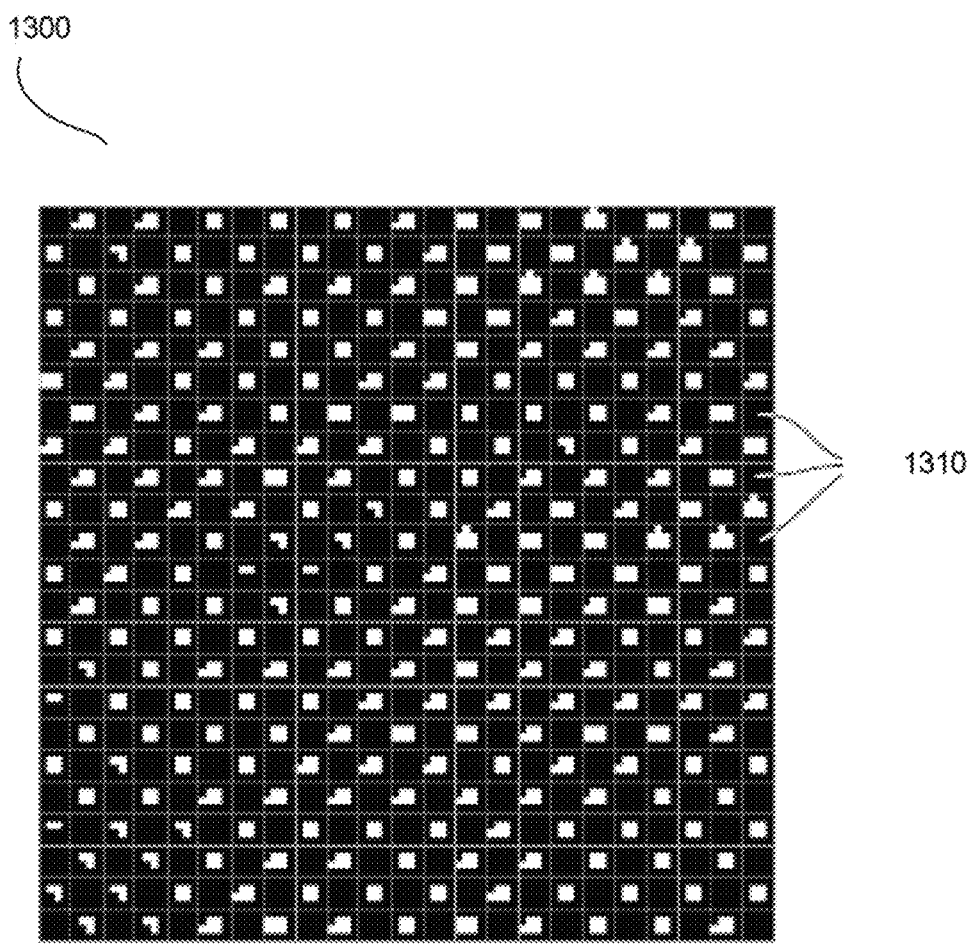
FIG. 13 illustrates an example of a cropped region cropped from an all shadow portion of a data-bearing halftone image.

Using the halftone cell pattern in the example of FIG. 11, an all shadow region 1300 may be captured from an all shadow portion of a data-bearing halftone image, as shown in the example of FIG. 13, where the boundaries of the halftone cells are superimposed. For example, each cell highlight cell 1310 may be all black and unable to carry data.

Figure 14:
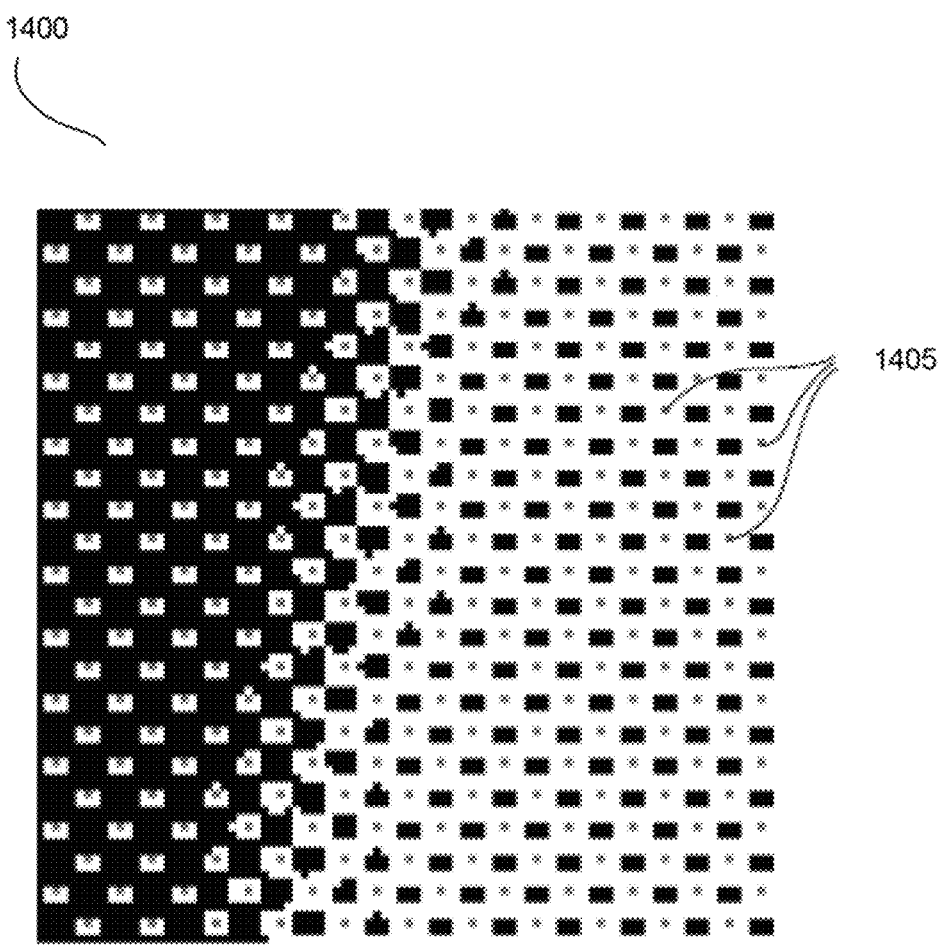
FIG. 14 illustrates an example of a cropped region cropped from a portion of a data-bearing halftone image where both highlights and shadows occur.

It is also possible to capture a region 1400 from a portion of a data-bearing halftone image where both highlights and shadows occur, as in the example of FIG. 14. For example, in FIG. 14, instead of superimposing the cell boundaries a dot 1405 is shown in each of the shadow cells to show where cells are data bearing (e.g., small white clusters) and non-data bearing (e.g., solid white cells). For example, FIG. 14 demonstrates that one cannot rely on a checkerboard pattern to locate potential data bearing cells.

The present disclosure has been shown and described with reference to the foregoing exemplary implementations. Although specific examples have been illustrated and described herein it is manifestly intended that the scope of the claimed subject matter be limited only by the following claims and equivalents thereof. It is to be understood, however, that other forms, details, and examples may be made without departing from the spirit and scope of the disclosure that is defined in the following claims.

What is claimed is:

1. A method of forming a data-bearing medium, comprising:
    setting variables associated with the data-bearing medium, the variables comprising a bit length of a payload, a row-to-row offset and an interleave period;
    identifying a standard form of the payload, the standard form being a circularly shifted version of the payload;
    generating a phase code based on the variables; and
    arranging the data-bearing medium with a row having the standard form of the payload, a row having the standard form of the payload circularly shifted with the row-to-row offset, and a row of the phase code, the arranging based on the interleave period.

2. The method of claim 1, wherein arranging the rows of the data-bearing medium further comprises filling a row with the phase code following a predetermined number of rows with the standard form of the payload.

3. The method of claim 2, wherein the predetermined number of rows with the standard form of the payload is equal to the interleave period minus one.

4. The method of claim 1, wherein arranging the rows of the data-bearing medium further comprises arranging a two-dimensional array of bits.

5. The method of claim 4, wherein positions of the bits in each row of the two-dimensional array of bits are circularly shifted from positions of the bits in an immediately preceding row by the row-to-row offset.

6. The method of claim 4, further comprising converting the two-dimensional array of bits to a two-dimensional array of data-bearing elements of the data-bearing medium so that the data-bearing elements encode the bits in the two-dimensional array of bits.

7. The method of claim 1, wherein the bit length of the payload is odd, the row-to-row offset is even, and the interleave period is odd.

8. The method of claim 1, wherein generating the phase code further comprises repeating each of a number of bits representing the circular shift twice for each bit of circular shift, and continuing until all the bits of payload are filled.

9. The method of claim 1, wherein generating a phase code further comprising using portion of the phase code with one's complement of corresponding bit positions in the standard form.

10. The method of claim 1, wherein generating a phase code further comprises:
    if number of bits representing the circular shift is odd, repeating the bits of the circular shift to fill the bits of the payload; and
    if number of bits representing the circular shift is even, increasing the number by one bit with one's complement of corresponding bit position in the standard form and repeating the increased number of bits of the circular shift to fill the bits of the payload.

11. The method of claim 1, wherein generating a phase code further comprising repeating each of a number of bits representing the circular shift twice for each bit of the circular shift.

12. The data-bearing medium of claim 1, wherein the data-bearing medium comprises a data-bearing halftone image, a barcode, an atomic data-bearing medium, a magnetic data-bearing medium, a data-bearing image, or an optical data-bearing medium.

13. A method of recovering a payload from a data-bearing medium, comprising:
    decoding data-bearing elements in the data-bearing medium into an array of bits;
    selecting a set of rows of the array of bits from a number of sets of rows of the array of bits;
    identifying a version of phase code corresponding to the set of rows of the array of bits;
    determining a standard form of the version of the payload from a first row of the array of bits;
    determining the phase code of the version of the phase code from a second row of the array of bits;
    determining a row-to-row circular shift between the phase code and the version of the phase code; and
    shifting the standard form of the version of the payload by the circular shift to recover the payload.

14. A data-bearing medium, comprising:
    an array of data-bearing elements;
    wherein the array of data-bearing elements represents an array of bits;
    wherein a phase code is generated based on variables associated with the data-bearing medium, the variables comprising a bit length of a payload, a row-to-row offset and an interleave period; and
    wherein the array of bits are arranged with a row having a standard form of the payload, a row of the array of bits having the standard form of the payload circularly shifted with the row-to-row offset from an immediately preceding row, and a row of the phase code, the rows of the array of bits based on the interleave period.

15. The method of claim 14, wherein selecting a set of rows of the array of bits from a number of sets of rows of the array of bits further comprises determining a level of confidence for each version of the payload associated with each set of rows of the array of bits and selecting the set of rows of the array of bits associated with the version of the payload with the highest level of confidence.

\* \* \* \* \*